US008329544B2

(12) United States Patent
Kang et al.

(10) Patent No.: US 8,329,544 B2
(45) Date of Patent: Dec. 11, 2012

(54) METHOD FOR FORMING A SEMICONDUCTOR DEVICE HAVING NANOCRYSTALS

(75) Inventors: Sung-Taeg Kang, Austin, TX (US); Jane A. Yater, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/085,238

(22) Filed: Apr. 12, 2011

(65) Prior Publication Data

US 2012/0264282 A1 Oct. 18, 2012

(51) Int. Cl.
*H01L 21/336* (2006.01)

(52) U.S. Cl. ................. 438/288; 438/591; 257/E21.679

(58) Field of Classification Search ............. 257/E21.18, 257/E21.191, E21.207, E21.4, E21.613
See application file for complete search history.

(56) References Cited

U.S. PATENT DOCUMENTS

| | | | |
|---|---|---|---|
| 5,937,295 | A | 8/1999 | Chen et al. |
| 6,060,743 | A | 5/2000 | Sugiyama et al. |
| 6,808,986 | B2 | 10/2004 | Rao et al. |
| 7,550,802 | B2 | 6/2009 | Koyanagi et al. |
| 7,799,634 | B2 | 9/2010 | Shen et al. |

OTHER PUBLICATIONS

Hori et al.; "A MOSFET with Si-implanted Gate-SiO2 Insulator for Nonvolatile Memory Applicatons"; IEDM; 1992; pp. 17.7.1-17.7.4; IEEE.

Ohzone et al.; Erase/Write Cycle Tests of n-MOSFET's with Si-Implanted Gata-SiO2; IEEE Transactions on Electron Devices; Sep. 1996; vol. 43, No. 9; IEEE.

Zacharias et al.; "Size-Controlled Si Nanocrystals"; 2006; 2 Pg Abstract; Max Planck Institute for Microstucture Physics.

Lu et al.; "Multilevel charge storage in silicon nanocrystal multilayers"; Applied Physics Letters; Nov. 2005; pp. 44-45; vol. 87, No. 20; IEEE.

Notice of Allowance Dated Aug. 7, 2012 for U.S. Appl. No. 13/085,230.

*Primary Examiner* — Cheung Lee

(74) *Attorney, Agent, or Firm* — Joanna G. Chiu; Daniel D. Hill

(57) ABSTRACT

A method is provided for forming a semiconductor device having nanocrystals. The method includes: forming a first insulating layer over a surface of a substrate; forming a first plurality of nanocrystals on the first insulating layer; implanting a first material into the first insulating layer; and annealing the first material to form a second plurality of nanocrystals in the first insulating layer. The method may be used to provide a charge storage layer for a non-volatile memory having a greater nanocrystal density.

20 Claims, 8 Drawing Sheets

METHOD FOR FORMING A SEMICONDUCTOR DEVICE HAVING NANOCRYSTALS

CROSS-REFERENCE TO RELATED APPLICATION(S)

This application is related to U.S. patent application Ser. No. 13/085,230, filed on even date, entitled "METHOD FOR FORMING A SEMICONDUCTOR DEVICE HAVING NANOCRYSTALS," naming Sung-Taeg Kang and Jane Yater as inventors, and assigned to the current assignee hereof.

BACKGROUND

1. Field

This disclosure relates generally to semiconductor processing, and more specifically, to a method for forming a semiconductor device having nanocrystals.

2. Related Art

Non-volatile data storage is commonly used in integrated circuits. In one type of semiconductor device structure used for non-volatile data storage, nanocrystals are used to store charge. The charge capturing capability of the nanocrystals is affected by the density, size, and distribution of the nanocrystals. Smaller nanocrystals may be formed more closely together to increase density. However, the closer spacing causes the nanocrystals to be more susceptible to leakage and physically touching neighboring nanocrystals, which may reduce performance. Also, smaller nanocrystals have reduced charge capacity as compared to larger nanocrystals. Larger nanocrystals are typically spaced further apart from each other as compared to smaller nanocrystals, allowing them to be less susceptible to leakage. However, the larger spacing results in larger regions of oxide between nanocrystals which may trap excess electrons during operation. This may result in reduced cycling endurance of the storage device.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As described above, the charge storage capability of nanocrystals is affected by size, density, and distribution of the nanocrystals. In one embodiment of the present invention, a first plurality of nanocrystals is first formed, and, after formation of the first plurality of nanocrystals, a second plurality of nanocrystals is formed such that nanocrystals of the second plurality of nanocrystals are formed in regions of insulating material located between nanocrystals of the first plurality of nanocrystals.

Figure 1:
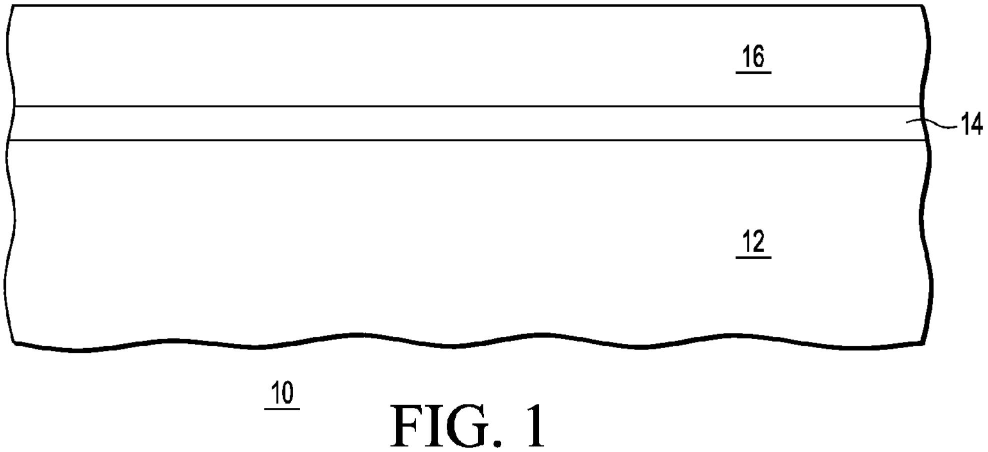
FIG. 1 illustrates a semiconductor device at a stage of processing in accordance with an embodiment of the present invention.

FIG. 1 illustrates a semiconductor device 10 after formation of a first insulating layer 14 over a surface of a semiconductor substrate 12, and a semiconductor layer 16 over first insulating layer 14. Semiconductor substrate 12 can be any semiconductor material or combinations of materials, such as gallium arsenide, silicon germanium, silicon-on-insulator (SOI), silicon, monocrystalline silicon, the like, and combinations of the above. First insulating layer 14 is formed over substrate 12, such as by growth or deposition, and a semiconductor layer 16 is deposited, such as by using chemical vapor deposition (CVD), over insulating layer 14. Semiconductor layer 16 may be a continuous or discrete film. In one embodiment, first insulating layer 14 includes an oxide and may also be referred to as a first dielectric layer or as a bottom dielectric layer. In one embodiment, semiconductor layer 16 includes a semiconductor material, such as silicon (e.g. amorphous silicon), germanium or the like. Alternatively, semiconductor layer 16 may include a metal.

Figure 2:
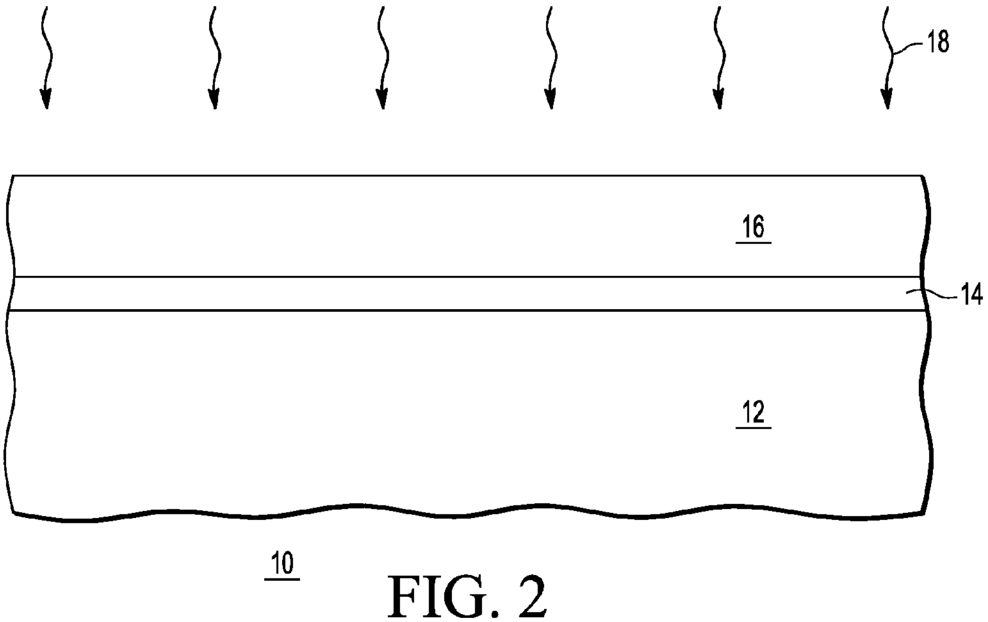
FIG. 2 illustrates the semiconductor device of FIG. 1 at a subsequent stage of processing in accordance with an embodiment of the present invention.
Figure 3:
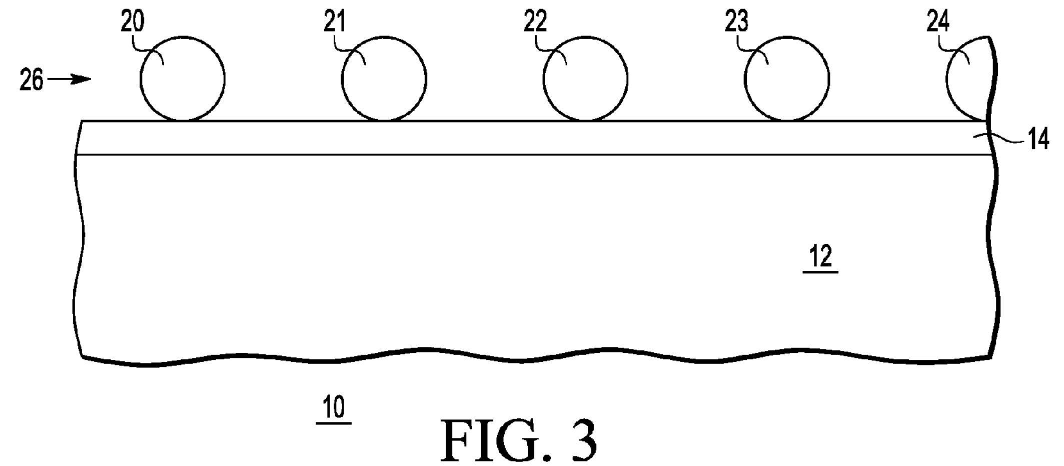
FIG. 3 illustrates the semiconductor device of FIG. 2 at a subsequent stage of processing in accordance with an embodiment of the present invention.

FIG. 2 illustrates semiconductor device 10 at a subsequent stage in processing in which an anneal 18 is performed. Semiconductor layer 16 is annealed to form a first plurality of nanocrystals 26 (as illustrated in FIG. 3). In one embodiment, the anneal is performed at a temperature in a range of approximately 600 to 950 degrees Celsius. In one embodiment, the anneal is performed at a temperature of approximately 750 degrees Celsius. As illustrated in FIG. 3, as a result of anneal 18, first plurality of nanocrystals 26, including nanocrystals 20-24, is formed over first insulating layer 14. In one embodiment, first plurality of nanocrystals 26 has an average diameter in a range of approximately 50 to 150 Angstroms.

Note that, in alternate embodiments, the steps of deposition of a semiconductor material (such as the CVD of semiconductor layer 16) followed by the anneal (such as anneal 18) can be repeated for a predetermined number of iterations to form the first plurality of nanocrystals 26. For example, in one embodiment, after anneal 18 of FIG. 2, another layer of semiconductor material may be deposited (such as by CVD) over the plurality of nanocrystals and another anneal performed, in order to increase the density and/or size of first plurality of nanocrystals 26. In yet another alternate embodiment, other methods may be used to form first plurality of nanocrystals 26. For example, in one embodiment, pre-formed nanocrystals may be deposited over first insulating layer 14. In another embodiment, a semiconductor material can be implanted into first insulating layer 14 and subsequently annealed to form first plurality of nanocrystals 26. In this embodiment, nanocrystals 20-24 may be surrounded by insulating material. Also, the subsequent anneal may be performed later in processing, such as when the source and drain regions of the device are annealed.

Figure 4:
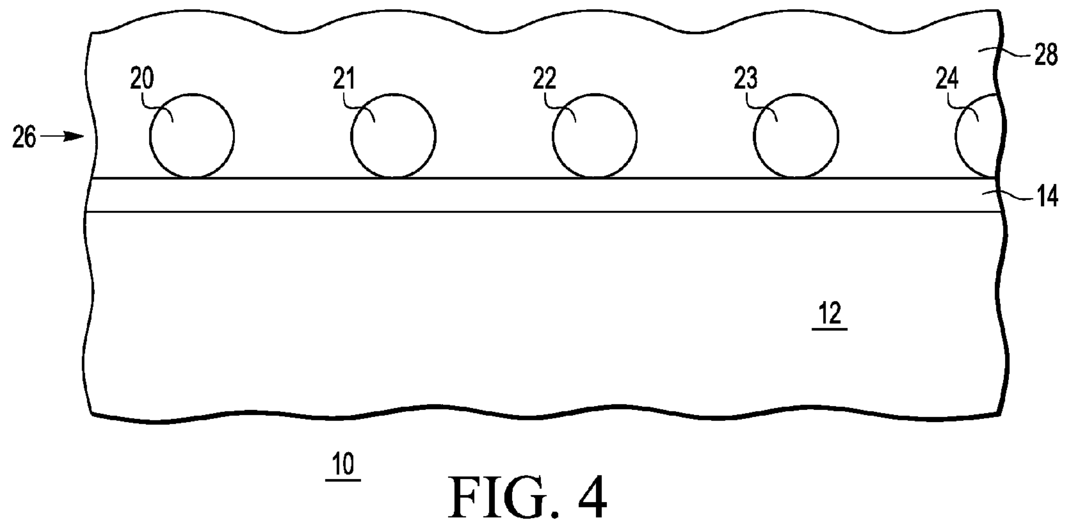
FIG. 4 illustrates the semiconductor device of FIG. 3 at a subsequent stage of processing in accordance with an embodiment of the present invention.

FIG. 4 illustrates semiconductor device 10 after formation of a second insulating layer 28 over first plurality of nanocrystals 26 (over nanocrystals 20-24). As illustrated in FIG. 4, after the formation of first plurality of nanocrystals 26 is complete, second insulating layer 28 may be formed, such as by deposition, over first plurality of nanocrystals 26. In one embodiment, second insulating layer 28 includes an oxide and may be referred to as a top dielectric layer.

Figure 5:
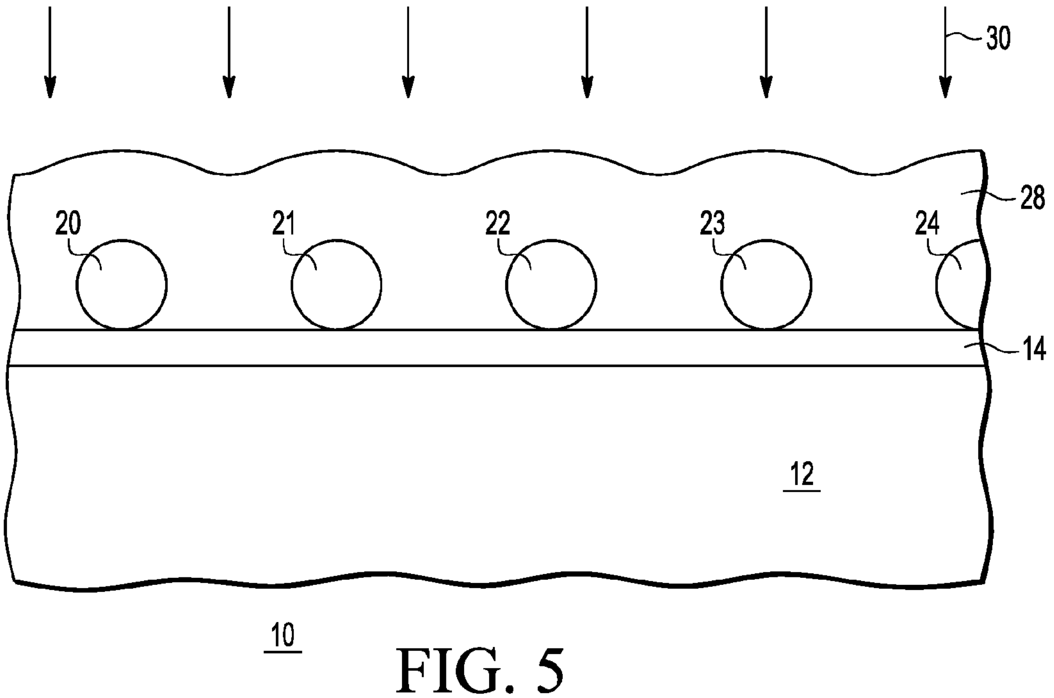
FIG. 5 illustrates the semiconductor device of FIG. 4 at a subsequent stage of processing in accordance with an embodiment of the present invention.

FIG. 5 illustrates semiconductor device 10 at a subsequent stage in processing in which an implant 30 is performed into second insulating layer 28. In one embodiment, the implant material used for implant 30 may include a semiconductor material, such as silicon, germanium, or the like, or may include a metal. In one embodiment, implant 30 is a shallow implant which is centered within second insulating layer 28 through control of implant energy and which does not extend into substrate 12.

Figure 6:
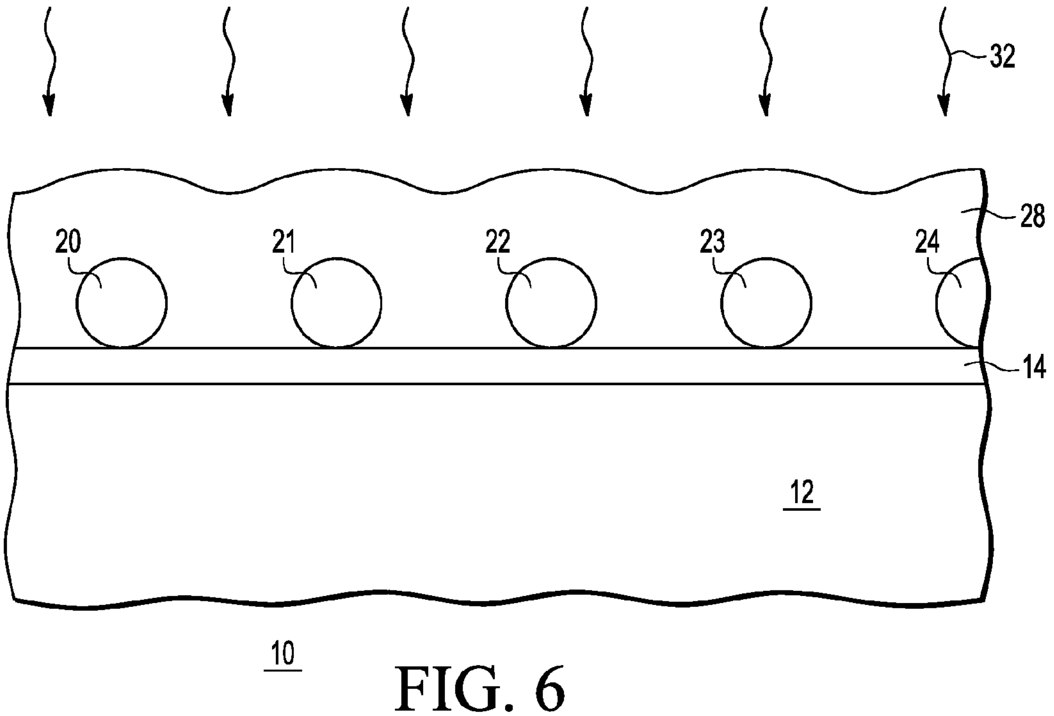
FIG. 6 illustrates the semiconductor device of FIG. 5 at a subsequent stage of processing in accordance with an embodiment of the present invention.
Figure 7:
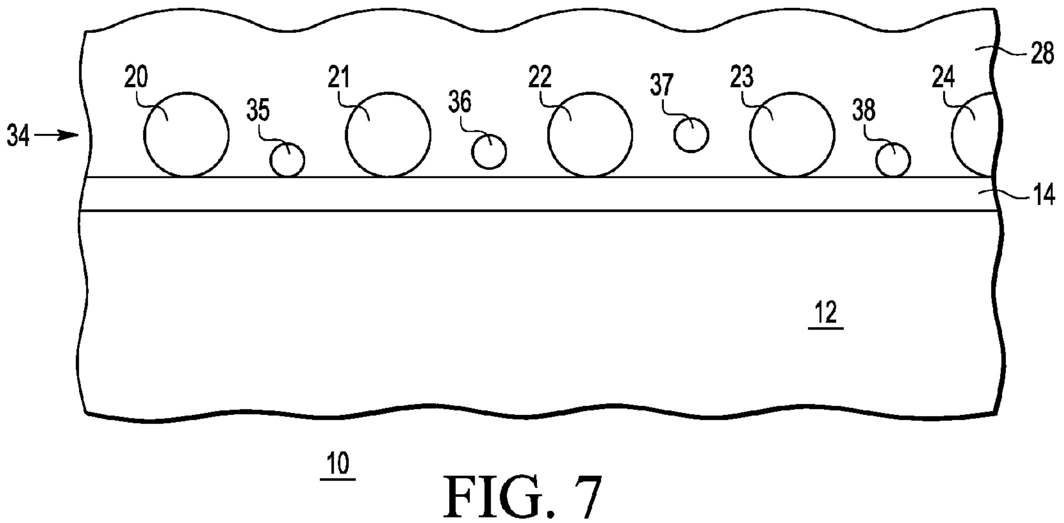
FIG. 7 illustrates the semiconductor device of FIG. 6 at a subsequent stage of processing in accordance with an embodiment of the present invention.

FIG. 6 illustrates semiconductor device 10 at a subsequent stage in processing in which an anneal 32 is performed. Therefore, after implant 30 is performed, the implant material is annealed to form a second plurality of nanocrystals, as illustrated in FIG. 7. For example, the anneal results in the implant material crystallizing to form nanocrystals made from the implant material. Therefore, as illustrated in FIG. 7, a second plurality of nanocrystals 34 is formed, which includes nanocrystals 35-38. Nanocrystals 35-38 are formed in regions of insulating material located between nanocrystals 20-23. Note that nanocrystals 35-38 may be formed at various different depths within second insulating layer 28, which can be controlled by implant conditions such as energy. In one embodiment, second plurality of nanocrystals 34 has an average diameter in a range of approximately 30 to 70 Angstroms. In one embodiment, the average diameter of second plurality of nanocrystals 34 is less than the average diameter of first plurality of nanocrystals 26. Also, in one embodiment, the first and second plurality of nanocrystals together provide a nanocrystal density greater than about 1e12 nanocrystals per square centimeter ($cm^2$).

Figure 8:
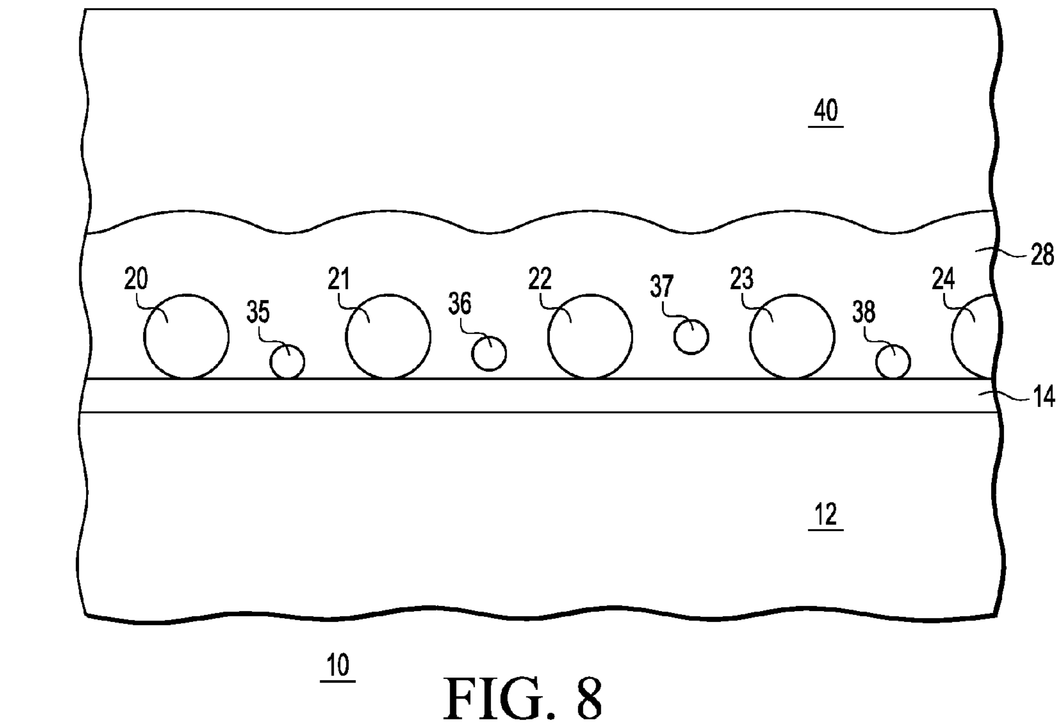
FIG. 8 illustrates the semiconductor device of FIG. 7 at a subsequent stage of processing in accordance with an embodiment of the present invention.

FIG. 8 illustrates semiconductor device 10 after formation of a semiconductor gate layer 40 over second insulating layer 28. In one embodiment, semiconductor gate layer 40 is a polysilicon layer.

Figure 9:
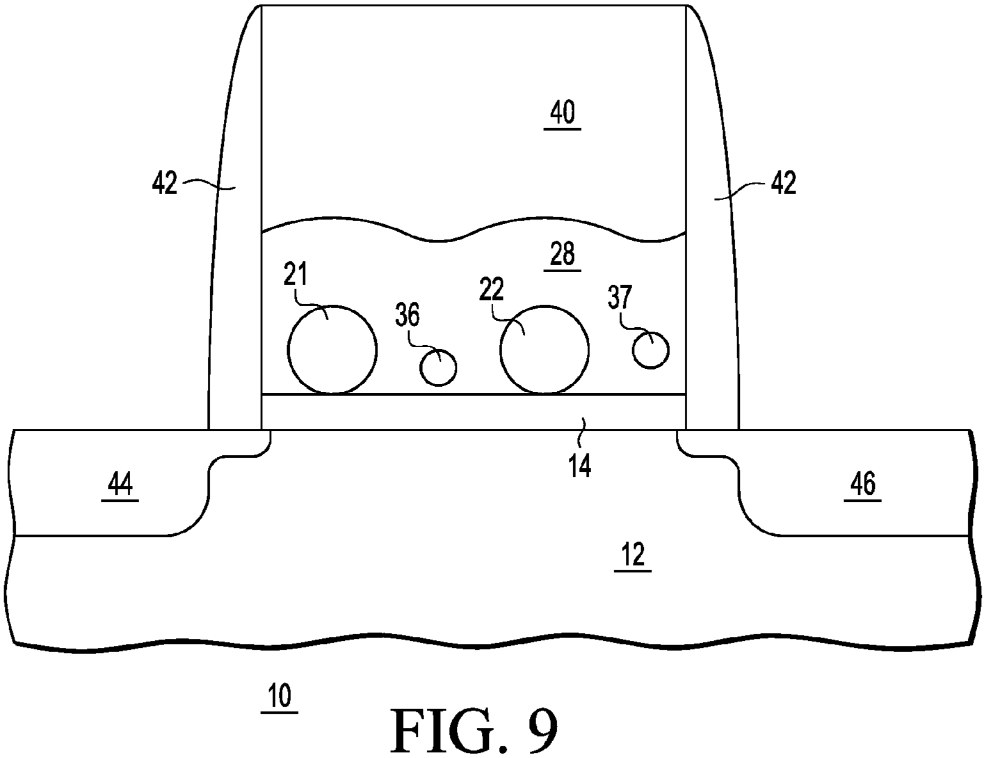
FIG. 9 illustrates the semiconductor device of FIG. 8 at a subsequent stage of processing in accordance with an embodiment of the present invention.

FIG. 9 illustrates semiconductor device 10 after patterning semiconductor gate layer 40 to form a gate stack, and after formation of a sidewall spacer 42 and source/drain regions 44 and 46. Semiconductor gate layer 40 is patterned to form a gate stack, in which the gate stack includes a portion of first insulating layer 14, a portion of first plurality of nanocrystals 26 (including, for example, nanocrystals 21 and 22) over the portion of first insulating material 14, a portion of second plurality of nanocrystals 34 (including, for example, nanocrystals 36 and 37) over the portion of first insulating material 14, a portion of second insulating layer 28 over the first and second pluralities of nanocrystals, and a portion of semiconductor gate layer 40 over the portion of second insulating layer 28. After the formation of the gate stack, sidewall spacer 42 may be formed surrounding the gate stack and source/drain regions 44 and 46 may be formed in substrate 12, laterally adjacent the sidewalls of the gate stack. Therefore, in one embodiment, semiconductor device 10 in FIG. 9 is a substantially completed semiconductor device which may be used, for example, as a non-volatile storage device in a non-volatile memory cell.

Note that the subsequent formation of the second plurality of nanocrystals (e.g. nanocrystals 36 and 37) after formation of the first plurality of nanocrystals reduces the open spaces of insulating material present between the nanocrystals of the first plurality of nanocrystals (e.g. nanocrystals 21 and 22). In this manner, a greater amount of charge can be stored within the nanocrystals (both the first and second plurality of nanocrystals), while reducing the amount of electrons that can get trapped in the insulating material between the nanocrystals. This may, for example, result in improved performance and improved cycle endurance of the memory cell. Furthermore, note that first plurality of nanocrystals 26 and second plurality of nanocrystals 34 may be formed of different materials.

Figure 10:
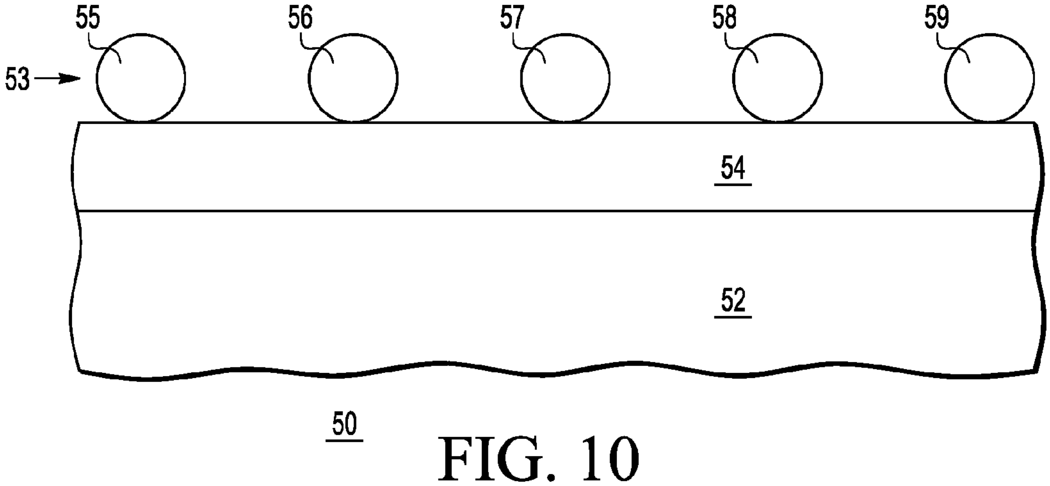
FIG. 10 illustrates a semiconductor device at a stage of processing in accordance with an embodiment of the present invention.

FIG. 10 illustrates a semiconductor device 50 after formation of a first insulating layer 54 over a surface of a semiconductor substrate 52, and a first plurality of nanocrystals 53 over first insulating layer 54. Semiconductor substrate 52 can be any semiconductor material or combinations of materials, such as gallium arsenide, silicon germanium, silicon-on-insulator (SOI), silicon, monocrystalline silicon, the like, and combinations of the above. In one embodiment, first insulating layer 54 includes an oxide and may also be referred to as a first dielectric layer or as a bottom dielectric layer. First plurality of nanocrystals 53 may include a semiconductor material, such as silicon or germanium or the like, or may include a metal. In one embodiment, first plurality of nanocrystals 53 (including nanocrystals 55-59) is formed over first insulating layer 54 as described above in reference to FIGS. 1-3 with respect to first plurality of nanocrystals 26. That is, for example, a layer of semiconductor material (such as amorphous silicon) may be deposited (such as by CVD) over first insulating layer 54 and an anneal may subsequently be performed (similar to anneal 18 described above). This deposition of a semiconductor material and subsequent anneal may also be repeated for a predetermined number of iterations, as needed, to form first plurality of nanocrystals 53. Alternatively, other methods may be used to form first plurality of nanocrystals 53. For example, pre-formed nanocrystals may be deposited over first insulating layer 54.

Figure 11:
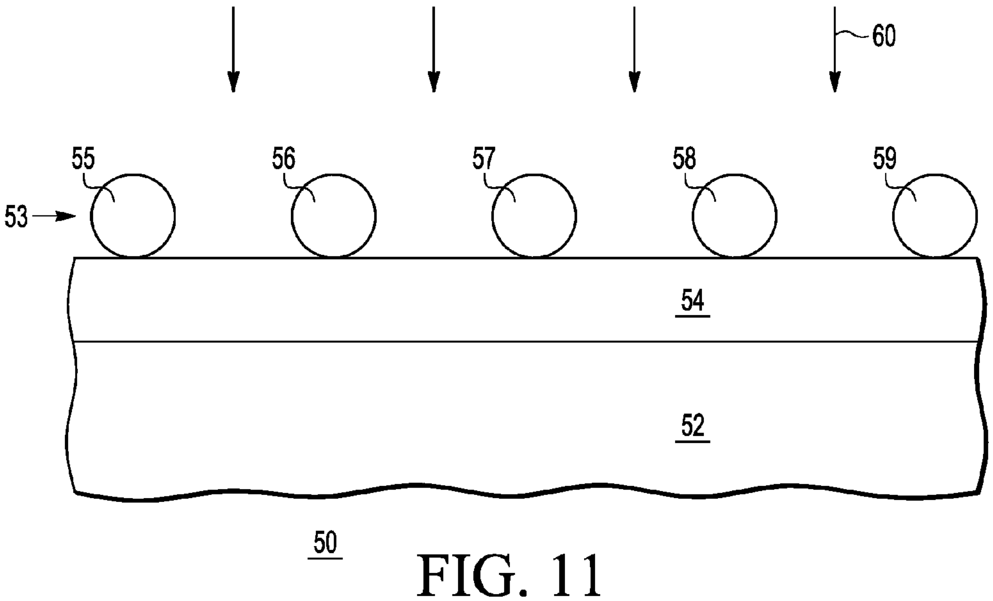
FIG. 11 illustrates the semiconductor device of FIG. 10 at a subsequent stage of processing in accordance with an embodiment of the present invention.

FIG. 11 illustrates semiconductor device 50 at a subsequent stage in processing in which an implant 60 is performed into first insulating layer 54 at a depth controlled by the implant energy. In one embodiment, the implant material used for implant 60 may include a semiconductor material, such as silicon, germanium, or the like, or may include a metal. In one embodiment, implant 60 is a shallow implant which does not extend into substrate 52. Also, note that the implant material for implant 60 may be a different material the material used to form first plurality of nanocrystals 53. Also, during implant 60, note that first plurality of nanocrystals 53, such as nanocrystals 55-59, act as masks during the implant such that the implant material ends up in regions of first insulating layer 54 located between nanocrystals and not directly beneath the nanocrystals.

Figure 12:
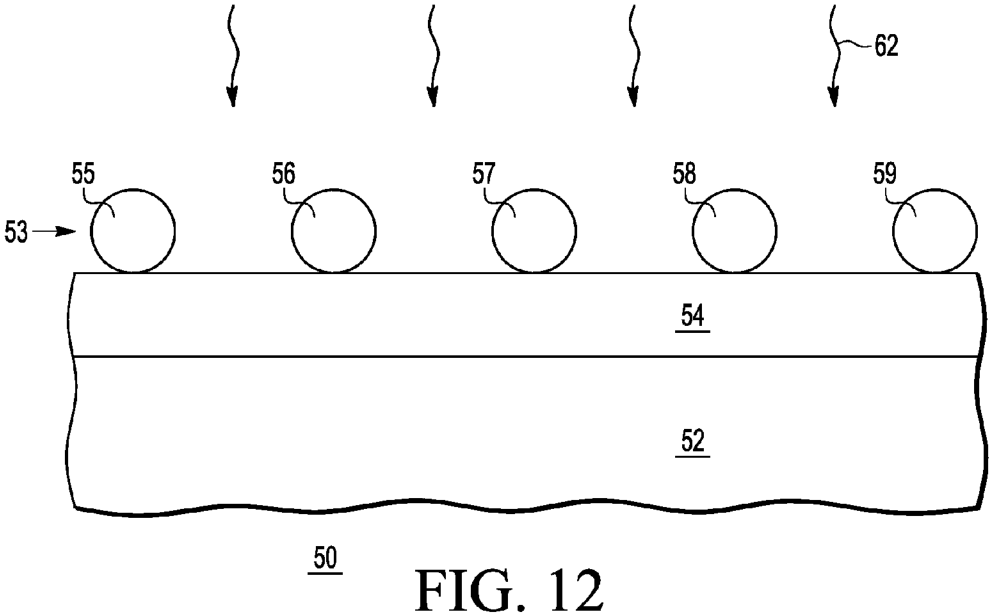
FIG. 12 illustrates the semiconductor device of FIG. 11 at a subsequent stage of processing in accordance with an embodiment of the present invention.
Figure 13:
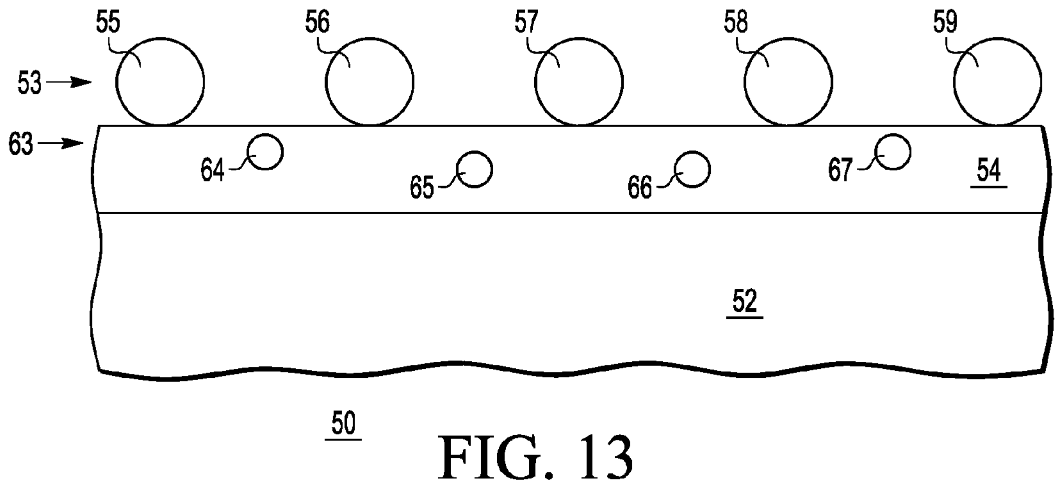
FIG. 13 illustrates the semiconductor device of FIG. 12 at a subsequent stage of processing in accordance with an embodiment of the present invention.

FIG. 12 illustrates semiconductor device 50 at a subsequent stage in processing in which an anneal 62 is performed. Therefore, after implant 60 is performed, the implant material is annealed to form a second plurality of nanocrystals, as illustrated in FIG. 13. For example, the anneal results in the implant material crystallizing to form nanocrystals made from the implant material. Therefore, as illustrated in FIG. 13, a second plurality of nanocrystals 63 is formed, which includes nanocrystals 64-67, within first insulating layer 54. Nanocrystals 64-67 are formed in regions of insulating material located between nanocrystals 55-59, since nanocrystals 55-59 acted as masks during implant 60, substantially preventing implant material from ending up beneath the nanocrystals themselves. Note that nanocrystals 64-67 may be formed at various different depths within first insulating layer 54. Also, note that second plurality of nanocrystals 63 is located under first plurality of nanocrystals 53 since they are located within a layer (first insulating layer 54) that is under first plurality of nanocrystals 53. In one embodiment, second plurality of nanocrystals 63 has an average diameter in a range of approximately 30 to 70 Angstroms. In one embodiment, the average diameter of second plurality of nanocrystals 63 is less than the average diameter of first plurality of nanocrystals 53. Also, in one embodiment, the first and second plurality of nanocrystals together provide a nanocrystal density greater than about 1e12 nanocrystals per square centimeter ($cm^2$).

Note that since first plurality of nanocrystals 53 operate as a mask during implant 60, the formation of first plurality of nanocrystals 53 by deposition may allow for improved control over formation and resulting density of first plurality of nanocrystals 53. In this manner, the nanocrystals of second plurality of nanocrystals 63 may be more likely to form in those regions of insulating material located between the nanocrystals of first plurality of nanocrystals 53 and not be located too close to the nanocrystals of first plurality of nanocrystals 53. Also, during implant 60, the nanocrystals of first plurality of nanocrystals 53 may increase in size depending on the implant material used for implant 60.

Figure 14:
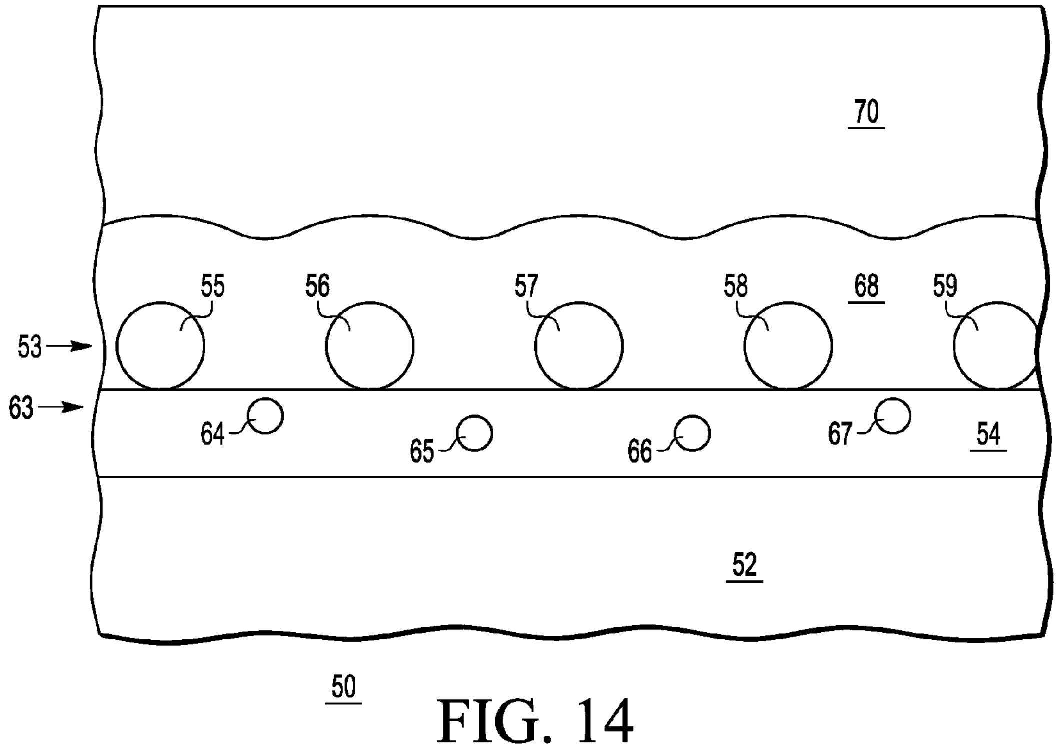
FIG. 14 illustrates the semiconductor device of FIG. 13 at a subsequent stage of processing in accordance with an embodiment of the present invention.

FIG. 14 illustrates semiconductor device 50 after formation of a second insulating layer 68 over first plurality of nanocrystals 53 (over nanocrystals 55-59) and after formation of a semiconductor gate layer 70 over second insulating layer 68. As illustrated in FIG. 14, after the formation of first plurality of nanocrystals 53 over first insulating layer 54 and the formation of second plurality of nanocrystals 63 within first insulating layer 54 are complete, second insulating layer 68 may be formed, such as by deposition, over first plurality of nanocrystals 53. In one embodiment, second insulating layer 68 includes an oxide and may be referred to as a top dielectric. Also, in one embodiment, semiconductor gate layer 70 is a polysilicon layer.

Figure 15:
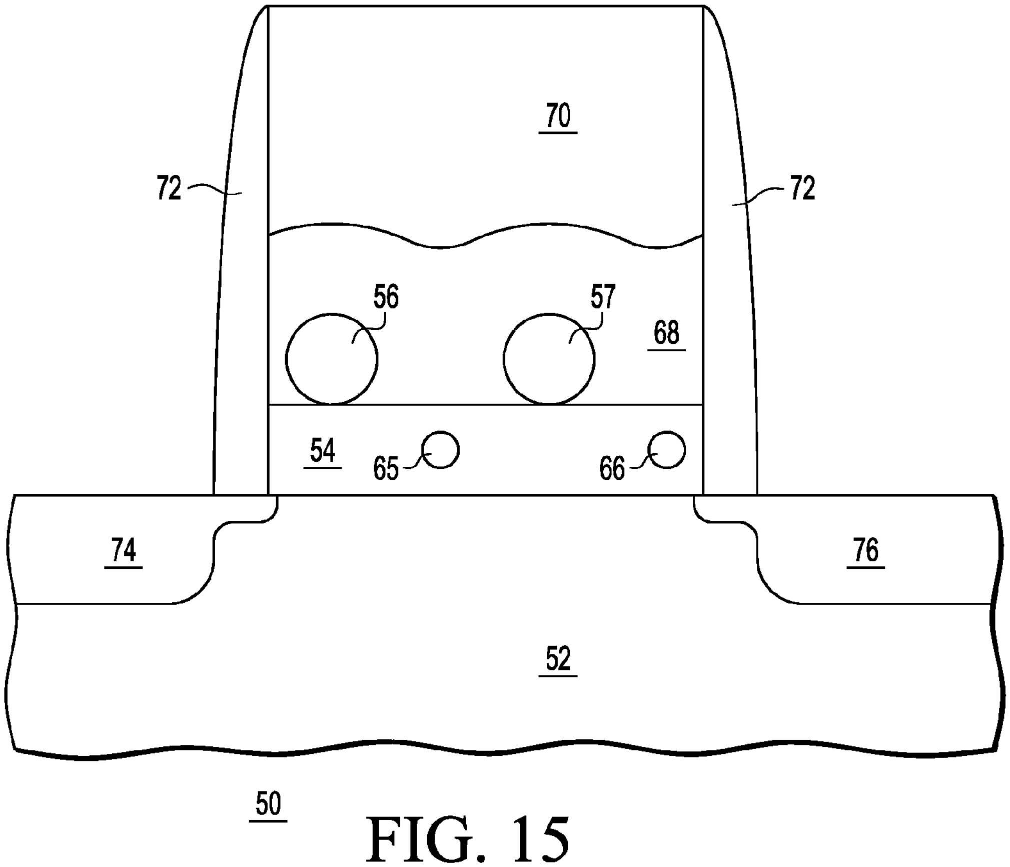
FIG. 15 illustrates the semiconductor device of FIG. 14 at a subsequent stage of processing in accordance with an embodiment of the present invention.

FIG. 15 illustrates semiconductor device 50 after patterning semiconductor gate layer 70 to form a gate stack, and after formation of a sidewall spacer 72 and source/drain regions 74 and 76. Semiconductor gate layer 70 is patterned to form a gate stack, in which the gate stack includes a portion of first insulating layer 54, a portion of second plurality of nanocrystals 63 (including, for example, nanocrystals 65 and 66) within first insulating layer 54, a portion of first plurality of nanocrystals 53 (including, for example, nanocrystals 56 and 57) over the portion of first insulating layer 54, a portion of second insulating layer 68 over the portion of first plurality of nanocrystals 53, and a portion of semiconductor gate layer 70 over the portion of second insulating layer 68. After the formation of the gate stack, sidewall spacer 72 may be formed surrounding the gate stack and source/drain regions 74 and 76 may be formed in substrate 22, laterally adjacent the sidewalls of the gate stack. Therefore, in one embodiment, semiconductor device 50 in FIG. 15 is a substantially completed semiconductor device which may be used, for example, as a non-volatile storage device in a non-volatile memory cell.

Note that the subsequent formation of the second plurality of nanocrystals (e.g. nanocrystals 65 and 66) after formation of the first plurality of nanocrystals reduces the open spaces of insulating material present between the nanocrystals of the first plurality of nanocrystals (e.g. nanocrystals 56 and 57). In this manner, a greater amount of charge can be stored within the nanocrystals (both the first and second plurality of nanocrystals), while reducing the amount of electrons that can get trapped in the insulating material between the nanocrystals. This may, for example, result in improved performance and improved cycle endurance of the memory cell. Furthermore, note that first plurality of nanocrystals 53 and second plurality of nanocrystals 63 may be formed of different materials.

By now it should be appreciated that there has been provided a method for forming a semiconductor device in which, subsequent to the formation of a first plurality of nanocrystals, a second plurality of nanocrystals is formed within regions of insulating material located between nanocrystals of the first plurality of nanocrystals. In one embodiment, the second plurality of nanocrystals is formed by implanting an implant material into regions of insulating material, such as into the bottom dielectric layer or the top dielectric layer, and subsequently annealing the implant material. In this manner, the second plurality of nanocrystals may result in increased density of total nanocrystals (of both the first and second plurality of nanocrystals together) and thus may increase performance and cycle endurance.

Although the invention is described herein with reference to specific embodiments, various modifications and changes can be made without departing from the scope of the present invention as set forth in the claims below. For example, the second plurality of nanocrystals which are formed in regions of insulating material located between nanocrystals of the first plurality of nanocrystals may be located in either the bottom dielectric layer or the top dielectric layer. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Furthermore, the terms "a" or "an," as used herein, are defined as one or more than one.

Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method for forming a semiconductor device, the method including forming a first insulating layer over a surface of a substrate; forming a first plurality of nanocrystals on the first insulating layer; implanting a first material into the first insulating layer; and annealing the first material to form a second plurality of nanocrystals in the first insulating layer. Item 2 includes the method of item 1, wherein forming the first plurality of nanocrystals includes depositing a second material on the first insulating layer; and annealing the second material to form the first plurality of nanocrystals. Item 3 includes the method of item 2, wherein the second material may include a semiconductor material or a metal. Item 4 includes the method of item 2, wherein the second material is amorphous silicon. Item 5 includes the method of item 1, and further includes forming a second insulating layer over the first plurality of nanocrystals; forming a polysilicon layer over the second insulating layer; and patterning the polysilicon layer to form a gate stack for a non-volatile memory cell. Item 6 includes the method of item 1, wherein annealing the first material further includes annealing the first material at a temperature between about 600 and 950 degrees Celsius. Item 7 includes the method of item 1, wherein the first and second pluralities of nanocrystals together provide a nanocrystal density greater than about 1E12 nanocrystals per square centimeter ($cm^2$). Item 9 includes the method of item 1, wherein the first plurality of nanocrystals have an average diameter of between about 50 to 150 Angstroms and the second plurality of nanocrystals have an average diameter of between about 30 to 70 Angstroms. Item 9 includes the method of item 1, wherein the first and second plurality of nanocrystals provide charge storage for a non-volatile memory cell.

Item 10 includes a method for forming a semiconductor device, the method including forming a first insulating layer over a surface of a substrate; depositing a first material on the first insulating layer; annealing the first material to form a first plurality of nanocrystals; implanting a second material into the first insulating layer; annealing the second material to form a second plurality of nanocrystals; and forming a second insulating layer over the first plurality of nanocrystals. Item 11 includes the method of item 10, wherein the steps of depositing the first material and annealing the first material further includes depositing and annealing the first material a predetermined number of iterations. Item 12 includes the method of item 10, and further includes forming a polysilicon layer over the second insulating layer; and patterning the polysilicon layer to form a gate stack for a non-volatile memory cell. Item 13 includes the method of item 10, wherein annealing the first material further includes annealing the first material at a temperature between about 600 and 950 degrees Celsius, and wherein annealing the second material further includes annealing the second material at a temperature between about 600 and 950 degrees Celsius. Item 14 includes the method of item 10, wherein the first and second pluralities of nanocrystals together provide a nanocrystal density greater than about 1E12 nanocrystals per square centimeter ($cm^2$). Item 15 includes the method of item 10, wherein the first plurality of nanocrystals have an average diameter of between about 50 to 150 Angstroms and the second plurality of nanocrystals have an average diameter of between about 30 to 70 Angstroms. Item 16 includes the method of item 10, wherein the first and second plurality of nanocrystals provide charge storage for a non-volatile memory cell.

Item 17 includes a method for forming a semiconductor device, the method including forming a first insulating layer over a surface of a semiconductor substrate; depositing amorphous silicon on the first insulating layer; annealing the amorphous silicon to form a first plurality of nanocrystals; implanting a semiconductor material into the first insulating layer; annealing the semiconductor material to form a second plurality of nanocrystals in the first insulating layer; forming a second insulating layer over the first plurality of nanocrystals; forming a polysilicon layer over the second insulating layer; and patterning the polysilicon layer to form a gate stack for a non-volatile memory cell. Item 18 includes the method of item 17, wherein the first plurality of nanocrystals have an average diameter of between about 50 to 150 Angstroms and the second plurality of nanocrystals have an average diameter of between about 30 to 70 Angstroms. Item 19 includes the method of item 17, wherein the steps of depositing the amorphous silicon and annealing the amorphous silicon further includes depositing and annealing the amorphous silicon a predetermined number of iterations. Item 20 includes the method of item 17, wherein the first and second pluralities of nanocrystals together provide a nanocrystal density greater than about 1E12 nanocrystals per square centimeter ($cm^2$).

What is claimed is:

1. A method for forming a semiconductor device, the method comprising:

forming a first insulating layer over a surface of a substrate;

forming a first plurality of nanocrystals on the first insulating layer;

implanting a first material into the first insulating layer; and annealing the first material to form a second plurality of nanocrystals in the first insulating layer.

2. The method of claim 1, wherein forming the first plurality of nanocrystals comprises:

depositing a second material on the first insulating layer; and annealing the second material to form the first plurality of nanocrystals.

3. The method of claim 2, wherein the second material may include a semiconductor material or a metal.

4. The method of claim 2, wherein the second material is amorphous silicon.

5. The method of claim 1, further comprising:

forming a second insulating layer over the first plurality of nanocrystals;

forming a polysilicon layer over the second insulating layer; and patterning the polysilicon layer to form a gate stack for a non-volatile memory cell.

6. The method of claim 1, wherein annealing the first material further comprises annealing the first material at a temperature between about 600 and 950 degrees Celsius.

7. The method of claim 1, wherein the first and second pluralities of nanocrystals together provide a nanocrystal density greater than about 1E12 nanocrystals per square centimeter ($cm^2$).

8. The method of claim 1, wherein the first plurality of nanocrystals have an average diameter of between about 50 to 150 Angstroms and the second plurality of nanocrystals have an average diameter of between about 30 to 70 Angstroms.

9. The method of claim 1, wherein the first and second plurality of nanocrystals provide charge storage for a non-volatile memory cell.

10. A method for forming a semiconductor device, the method comprising:

forming a first insulating layer over a surface of a substrate;

depositing a first material on the first insulating layer;

annealing the first material to form a first plurality of nanocrystals;

implanting a second material into the first insulating layer;

annealing the second material to form a second plurality of nanocrystals; and forming a second insulating layer over the first plurality of nanocrystals.

11. The method of claim 10, wherein the steps of depositing the first material and annealing the first material further comprises depositing and annealing the first material a predetermined number of iterations.

12. The method of claim 10, further comprising:

forming a polysilicon layer over the second insulating layer; and patterning the polysilicon layer to form a gate stack for a non-volatile memory cell.

13. The method of claim 10, wherein annealing the first material further comprises annealing the first material at a temperature between about 600 and 950 degrees Celsius, and wherein annealing the second material further comprises annealing the second material at a temperature between about 600 and 950 degrees Celsius.

14. The method of claim 10, wherein the first and second pluralities of nanocrystals together provide a nanocrystal density greater than about 1E12 nanocrystals per square centimeter ($cm^2$).

15. The method of claim 10, wherein the first plurality of nanocrystals have an average diameter of between about 50 to 150 Angstroms and the second plurality of nanocrystals have an average diameter of between about 30 to 70 Angstroms.

16. The method of claim 10, wherein the first and second plurality of nanocrystals provide charge storage for a non-volatile memory cell.

17. A method for forming a semiconductor device, the method comprising:

forming a first insulating layer over a surface of a semiconductor substrate;

depositing amorphous silicon on the first insulating layer;

annealing the amorphous silicon to form a first plurality of nanocrystals;

implanting a semiconductor material into the first insulating layer;

annealing the semiconductor material to form a second plurality of nanocrystals in the first insulating layer;

forming a second insulating layer over the first plurality of nanocrystals;

forming a polysilicon layer over the second insulating layer; and patterning the polysilicon layer to form a gate stack for a non-volatile memory cell.

18. The method of claim 17, wherein the first plurality of nanocrystals have an average diameter of between about 50 to 150 Angstroms and the second plurality of nanocrystals have an average diameter of between about 30 to 70 Angstroms.

19. The method of claim 17, wherein the steps of depositing the amorphous silicon and annealing the amorphous silicon further comprises depositing and annealing the amorphous silicon a predetermined number of iterations.

20. The method of claim 17, wherein the first and second pluralities of nanocrystals together provide a nanocrystal density greater than about 1E12 nanocrystals per square centimeter ($cm^2$).

* * * * *